US008827778B2

(12) United States Patent
Hartmann

(10) Patent No.: US 8,827,778 B2
(45) Date of Patent: Sep. 9, 2014

(54) COVER FOR AN AIR-CONDITIONING DEVICE

(75) Inventor: Reiner Hartmann, Wettenberg (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 13/261,471

(22) PCT Filed: Mar. 15, 2011

(86) PCT No.: PCT/EP2011/053896
§ 371 (c)(1),
(2), (4) Date: Oct. 11, 2012

(87) PCT Pub. No.: WO2011/128168
PCT Pub. Date: Oct. 20, 2011

(65) Prior Publication Data
US 2013/0040554 A1    Feb. 14, 2013

(30) Foreign Application Priority Data
Apr. 16, 2010   (DE) .......................... 10 2010 016 488

(51) Int. Cl.
*F24F 13/20*   (2006.01)

(52) U.S. Cl.
USPC ........... 454/184; 454/275; 454/367; 312/100; 361/605

(58) Field of Classification Search
CPC ............ H02B 1/56; H02B 11/20; H02B 5/00; H02G 3/08; H05K 7/20181; F24F 1/58
USPC ......... 454/241, 252, 265, 266, 275, 288, 330, 454/355, 367, 184; 312/100, 306; 361/605, 361/610, 649, 688, 690, 724, 725, 829, 361/831; 220/4.21, 552
See application file for complete search history.

(56) References Cited

U.S. PATENT DOCUMENTS

| 2,869,501 | A | * | 1/1959 | Stransky ........................ 114/202 |
| 4,222,318 | A | * | 9/1980 | Patton et al. .................. 98/94 R |
| 4,803,307 | A | * | 2/1989 | Shotey ............................ 174/67 |
| 5,573,562 | A |   | 11/1996 | Schauwecker et al. |
| 6,012,791 | A | * | 1/2000 | Benner et al. .............. 312/265.2 |
| 6,298,681 | B1 |  | 10/2001 | Esty et al. |

(Continued)

FOREIGN PATENT DOCUMENTS

| DE | 91 08 281 U1 | 9/1991 |
| DE | 43 44 659 C1 | 5/1995 |
| DE | 196 41 553 A1 | 4/1998 |
| EP | 0 979 978 A2 | 2/2000 |
| EP | 1 031 799 A2 | 8/2000 |

(Continued)

OTHER PUBLICATIONS

Pawlowski, Adam, "English Machine Translation of DE19641553A1", Apr. 1998, German Prov. Economic Patent.*

*Primary Examiner* — Kang Hu
*Assistant Examiner* — Dana Tighe
(74) *Attorney, Agent, or Firm* — Marshall & Melhorn, LLC

(57) ABSTRACT

The invention relates to a cover for at least one air-conditioning device arranged on a cladding element, in particular of a switchgear cabinet. The cover has a cover housing having a front wall and side parts connected thereto. The side parts keep the front wall at a distance from the cladding element. At least one holder for the cover housing is fitted to the cladding element. According to the invention, the holder comprises vertical hook elements into which the cover housing can be suspended by hook receptacles in the direction of gravity.

7 Claims, 5 Drawing Sheets

(56) References Cited

U.S. PATENT DOCUMENTS 6,308,526 B1 10/2001 Esty et al.
6,345,511 B1 * 2/2002 Esty et al. .................... 62/259.1
2005/0007747 A1 1/2005 Axelrod

FOREIGN PATENT DOCUMENTS

| JP | 58-102034 A | 6/1983 |
| JP | 5-296487 A | 11/1993 |
| JP | 10-009610 A | 1/1998 |

* cited by examiner

COVER FOR AN AIR-CONDITIONING DEVICE

BACKGROUND OF THE INVENTION

The invention relates to a cover for at least one air-conditioning device arranged on a cladding element in particular of a switchgear cabinet, comprising a cover housing having a front wall and side parts connected thereto, the side parts keeping the front wall at a distance from the cladding element, and at least one holder for the cover housing being fitted to the cladding element and wherein the holder comprises vertical hook elements in which the cover housing can be suspended by hook receptacles in the direction of gravity.

Switchgear cabinets are often operated in environments where they are subjected to dust and moisture. To protect the electronic built-in units installed in the switchgear cabinets, the switchgear cabinets are sealed against the environment. Heat produced by the electronic built-in units cannot be sufficiently dissipated merely by convection. It is for this reason that an opening is left out from a cladding element, for example a side wall or a lid part covering the switchgear cabinet. An air-conditioning device is inserted into this opening. Via this device, air may be sucked for cooling from the environment or may be dispensed thereto. As air-conditioning devices, fans, suction ducts or the like are often used. In many cases, the opening alone is sufficient as an air-conditioning device for increased convection.

In order to prevent that dust reaches the switchgear cabinet via the air-conditioning device, the opening is covered by a filter mat.

To keep moisture out, for example rain or splash water, it is known, for example from DE 43 44 659 C1, to use a cover. The cover consists of a closed cover housing which is open merely at the bottom and to the vertical side wall of the switchgear cabinet. For attaching the cover housing to the side wall, fixing screws are used. They are introduced through fixing seats of the fan which is inserted into the opening of the side wall. Bores are provided at the rear wall of the cover housing adjacent to the side wall through which the screw bolts of the fixing screws protrude. Nuts are screwed to the screw bolts so that the fan and the cover housing are tensioned with the side wall. Such mounting is very elaborate, since firstly the fixing screws and the fan must be held by a person from the interior of the switchgear cabinet. Now a second person introduces the nuts to the screw bolts through the downwardly open cover housing from the exterior of the switchgear cabinet and counters them.

A generic cover which may be more easily mounted compared to the cover of DE 43 44 659 C1 is known from DE 196 41 553 C2. The holder of DE 196 41 553 C2 possesses guides at which the cover may be suspended. Thus, the cover is directly connected to the stable cladding element. This feature ensures that even if violence is effected to the cover, the units below cannot be damaged easily. Further, the holder is equipped with vertical guides onto which the cover may be slid with the aid of guide seats. The guides are kept spaced apart from the cladding element.

By means of the guides, the cover housing may be attached to the cladding element. To this end the cover housing must be plugged onto the guides with its guide seats. Considerable space requirement above the guides is necessary which is determined by the length of the cover housing. Dismounting of the known cover is likewise elaborate.

EP 0 979 978 A2 discloses a transportable air-conditioning system, the housing thereof being closed by a cover in which hook elements are provided which snap into corresponding openings of the housing section front part.

JP 10-009610 A is concerned with an air-conditioning device, the housing thereof being suspended by a hook attached to a wall.

JP 5-296487 A shows a housing of an air-conditioning device which is suspended at an upstanding edge of a holder with the aid of an overlapping portion.

JP 58-102034 A shows an air-conditioning device to be mounted into a window. To this end, it is suspended by a hook provided at a mounting frame.

A cover of the type mentioned in the introductory is known from EP 1 031 799 A2. The cover described therein comprises hook elements in the region of its lateral edges which are aligned with hook receptacles provided in side parts of a housing and are mounted therein, wherein a foam tape seal is compressed which is intended to protect the interior of the housing from contaminations. It is indeed addressed that the effect of gravity is sufficient to retain the cover at the housing, however, this is not sufficient to establish impermeability, because the seal must additionally be compressed by locking screws 311 to serve the desired purpose.

SUMMARY OF THE INVENTION

Now it is the object of the invention to provide a cover which is particularly simple in construction compared to the generic cover and which allows a particularly good sealing while having small space requirement and good handling qualities when mounted or dismounted. The cover is intended to secure the covered air-conditioning device effectively against splash water and in particular also against strong directed water jets, namely to form a so-called hose-proof hood.

This object of the invention is solved by a cover according to the features of patent claim 1. Advantageous embodiments are described in the subclaims.

According to the invention, the holder is directly connected to the cladding element. Further, the hook receptacles provided at the cover housing are formed in receiving profiles connected to the associated side parts and extending along the side parts of the cover housing. The receiving profiles respectively comprise at least one profiled section which carries the hook receptacles and is arranged transversely to the direction of protrusion of the hook elements. The receiving profiles ensure stable mounting of the cover housing. In order to produce a particularly stable fitting method for the receiving profiles, they respectively comprise an abutment section which is bent parallel to the associated side part of the cover housing and is adjacent to the profiled section carrying the hook receptacles. The abutment section is connected to the inner surface of the associated side part, in particular glued or welded or brazed.

To disengage the hook receptacles of the cover housing from the hook elements, the cover housing must be lifted only by the vertical hook length. The same small space requirement upwards is needed for mounting or suspending, respectively, the hook receptacles to the hook elements. Such dismounting or mounting, respectively, at a cladding element, for example a side wall, a door or a cover part of a switchgear cabinet, is easy to manage, and the total space requirement is low.

In a simple reversal of the effect, the cover housing may comprise vertical hook elements which can be suspended by hook receptacles in the holder in the direction of gravity.

According to an embodiment, the holder may comprise at least two legs which are spaced apart from another and protrude from the cladding element towards the cover housing. Each leg comprises at least one vertical hook element protruding from the legs towards the cover housing. By spacing the legs or the hook elements mounted thereto, respectively, a particularly stable fitting method for the cover housing is produced.

In order to correctly position the cover at the air-conditioning device to be covered, an opening in the cladding element may be formed between the two legs in which the air-conditioning device can be inserted and secured. To this end, snap-in or lock elements or screw connections can be used.

According to a preferred embodiment, the holder may comprise a U-shaped support having two legs which are interconnected by a connecting section. Such an embodied holder is particularly stable and particularly easy to manage during mounting due to its integral construction. Moreover, the connecting section defines the distance between the two legs.

For positioning at the air-conditioning device to be covered, an opening is formed in the connecting section between the two legs which is substantially aligned with the opening of the cladding element and in which the air-conditioning device can be arranged. The connecting section may surround the air-conditioning device like a frame. Thereby, a pre-defined positioning of the holder and consequently of the cover is ensured.

The legs may be formed as flat shaped parts, the hook elements being formed integrally with the legs as extensions thereof. Such flat shaped parts may be easily produced from metal or plastics. The integral construction of legs and hook elements is particularly stable.

To facilitate positioning of the hook elements in the hook receptacles or maneuvering the hook elements into the hook receptacles, the profiled section carrying the hook receptacles is bent at a free end thereof at an angle towards the cladding element for forming a mounting assist for the hook elements.

Furthermore, the receiving profiles may comprise a profiled section which is bent to L-shape and is adjacent to the abutment section and which forms a vertical seal receiver extending along the side parts of the cover housing and open towards the cladding element. A sealing element may be inserted into the vertical seal receiver which at least partly protrudes towards the cladding element. When the cover housing is suspended in the hook receptacles by the hook elements, the protruding part of the sealing element contacts the cladding element. When the hook receptacles are completely suspended by the hook elements, the sealing element is compressed creating a sealing abutment. Furthermore, the sealing element serves as a resilient element due to its elastic deformability, where the hook receptacles must be suspended by the hook elements against the spring force thereof.

A lid element may be connected at an angle to the front wall of the cover housing. That oblique lid element forms a horizontal supporting section bent towards the cladding element. A bar which protrudes from the inner surface of the lid element towards the cladding element and is spaced apart from the supporting section defines a horizontal seal receiver open towards the cladding element. A sealing element may in turn be inserted into the horizontal seal receiver which at least partly protrudes towards the cladding element. When the cover housing is suspended in the hook receptacles by the hook elements, the protruding part of the sealing element inserted into the horizontal seal receiver contacts the cladding element in the same way as a sealing element inserted into the vertical seal receiver.

A particularly good sealing may be achieved in that a continuous sealing receiver for receiving a sealing element which at least partly protrudes towards the cladding element may be arranged at the side parts and the supporting section. Thus, an elongate one-piece sealing element may be used.

The cover housing can be made of metal, for example V2A steel, as a punched and bent component, or may be made of plastics.

BRIEF DESCRIPTION OF THE DRAWINGS

The invention will be explained in detail below with the aid of an exemplary embodiment illustrated in the drawings. It is shown in.

DETAILED DESCRIPTION OF THE INVENTION

Figure 1:
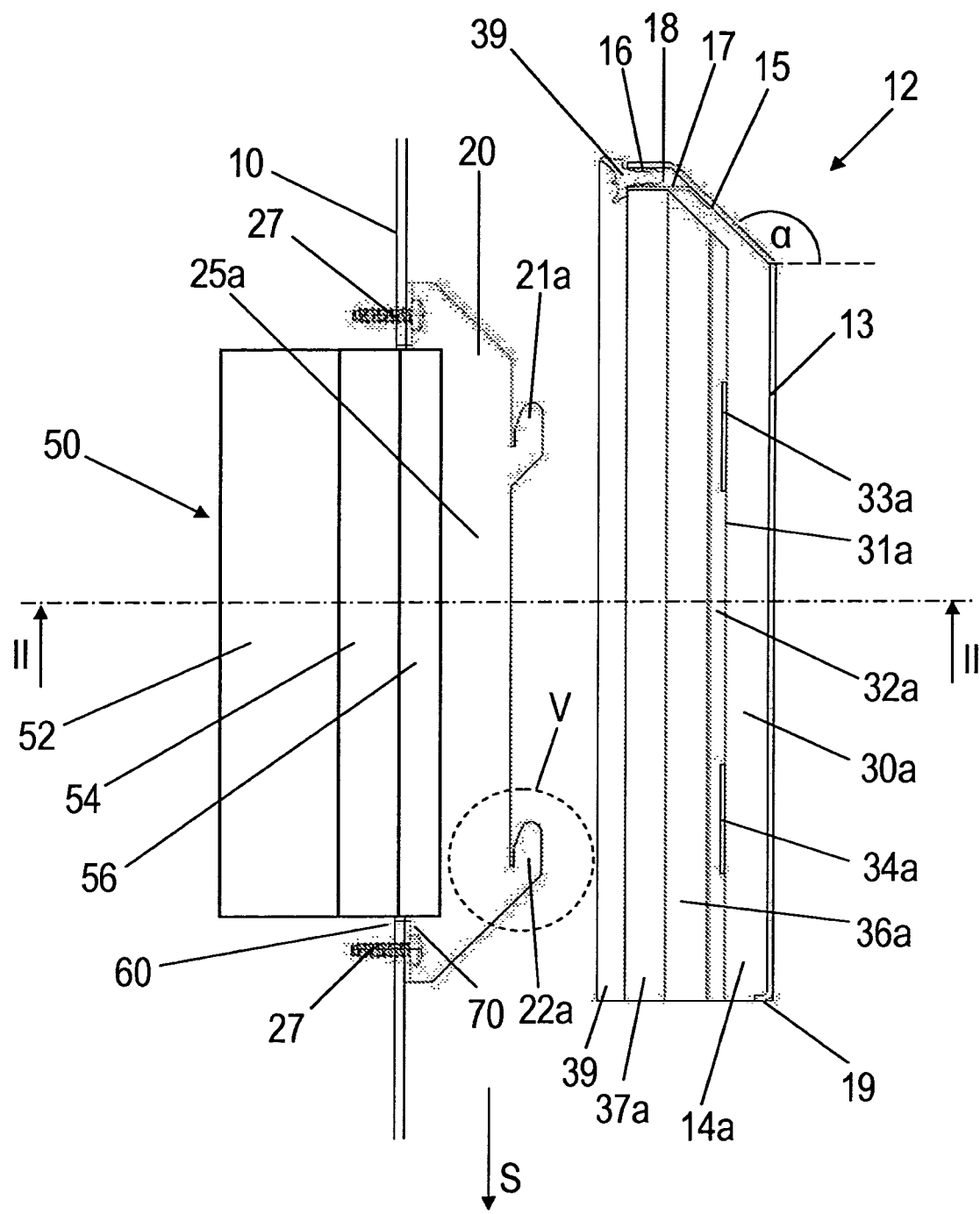
FIG. 1 in a schematic and sectional side view a cover, wherein the cover housing is illustrated in a condition separate from the holder.

FIG. 1 shows in a schematic and sectional side view a cover for an air-conditioning device 50 arranged on the outside of a cladding element 10 of a switchgear cabinet. In the illustrated example, cladding element 10 is a side wall of a switchgear cabinet.

Figure 2:
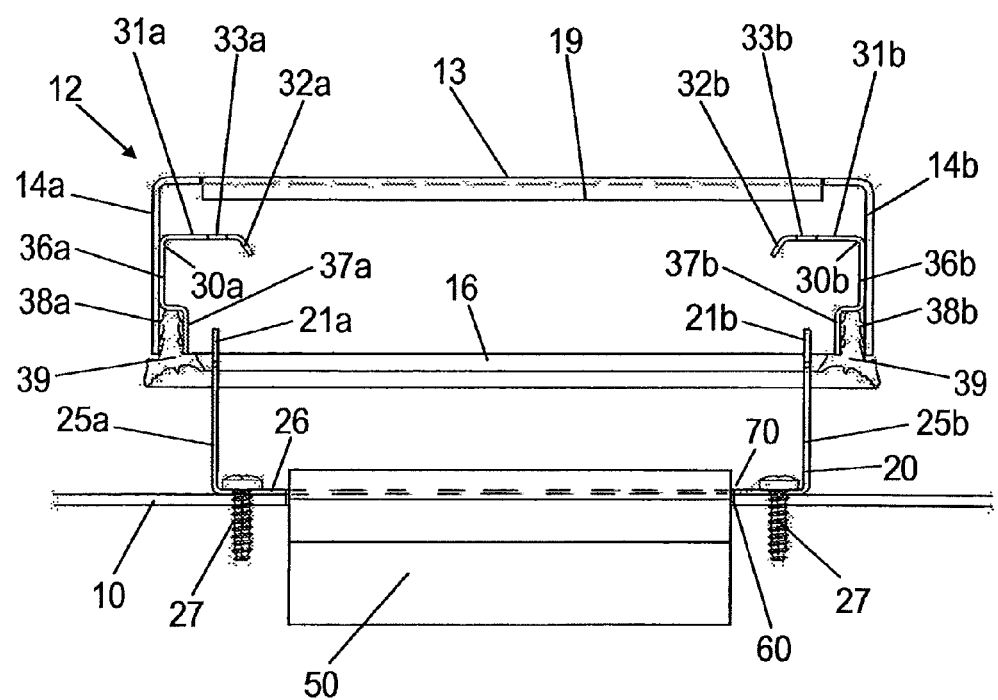
FIG. 2 in a schematic sectional view along section line II-II in FIG. 1 the cover of FIG. 1.

FIG. 2 shows the cover of FIG. 1 in a schematic sectional view along section line II-II of FIG. 1.

In the figures, air-conditioning device 50 is substantially illustrated as a highly simplified "black box". Illustrated air-conditioning device 50 is configured as a blower with a fan module conveying cool ambient air into the interior of the switchgear cabinet.

Alternatively, the air-conditioning device may be configured as a blower having a fan module conveying heated air from the interior of a switchgear cabinet to the outside. Further, the air-conditioning device may also be realized without a fan module.

Air-conditioning device 50 as shown in the figures is inserted into an opening 60 of cladding element 10. In the interior of the switchgear cabinet, air-conditioning device 50 comprises a fan housing 52 accommodating the fan module which is not shown. A filter mat 54 is applied to fan housing 52 from the outside. On the outside, filter mat 54 is held by a louvered grille 56 sitting thereon.

The cover comprises a cover housing 12 having a front wall 13. As is made clear with the aid of FIG. 2, a left side part 14*a* and a right side part 14*b* are connected to front wall 13. Side parts 14*a* and 14*b* keep front wall 13 spaced apart from cladding element 10. The cover housing 12 is made of V2A steel sheet as a punched and bent part. A holder 20 for covering housing 12 is attached to cladding element 10.

In FIGS. 1 and 2 cover housing 2 is illustrated in a condition separated from holder 20.

Holder 20 is formed as a U-shaped support and comprises two vertically extending legs protruding from cladding element 10 towards cover housing 12 which are spaced apart from another, namely left hand leg 25*a* and right hand leg 25*b*. Left hand leg 25*a* comprises two vertical hook elements 21*a* and 22*a* arranged one above the other. Also the right hand leg comprises a lower and an upper hook element, only upper hook element 21*b* being shown in FIG. 2.

Legs 25a and 25b are formed as flat punched shaped parts made of steel sheet. Hook elements 21a, 21b and 22a are integrally formed with legs 25a and 25b as extensions thereof.

The two legs 25a and 25b of the U-shaped support are interconnected by a connecting section 26. Legs 25a and 25b are integrally formed with connecting section 26. Opening 60 in cladding element 10 is made between the two legs 25a and 25b. Another opening 70 is formed in connecting section 26 between the two legs 25a and 25b which is aligned with opening 60 of cladding element 10. Air-conditioning device 50 is inserted into aligned openings 60 and 70. Connecting section 26 surrounds air-conditioning device 50 like a frame at the outside of cladding element 10. In the frame portion of connecting section 26, bolts for passing fixing screws 27 are made which in turn are inserted into screw seats attached in cladding element 10.

Cover housing 12 having hook receptacles 33a, 33b and 34a which are formed as vertical receiving slots may be suspended by vertical hook elements 21a, 21b and 22a in direction of gravity according to arrow S. Hook receptacles 33a, 33b and 34a are formed in profiled sections 31a and 31b of receiving profiles 30a and 30b extending along side parts 14a and 14b of cover housing 12. Profiled sections 31a and 31b are arranged transversely to the direction of protrusion of hook elements 21a, 21b; 22a. Left hand profiled section 31a comprises two vertical hook receptacles 33a and 34a arranged one above the other. Also right hand profiled section 31b comprises a lower and an upper hook receptacle where only upper hook receptacle 33b is shown in FIG. 2.

Receiving profiles 30a and 30b comprise abutment sections 36a and 36b bordering to profiled sections 31a and 31b which carry hook receptacles 33a, 33b and 34a, said abutment sections being bent parallel to associated side parts 14a or 14b, respectively of cover housing 12.

Left hand and right hand receiving profiles 30a and 30b are welded to the associated left hand and right hand side parts 14a or 14b, respectively, via their abutment sections 36a and 36b.

With the aid of FIG. 2 it is clear that the profiled sections 31a or 31b, respectively, carrying hook receptacles 33a and 33b, are bent at an angle towards the cladding element 10 at their free ends. These bends respectively form a mounting aid 32a and 32b for the hook elements.

Receiving profiles 30a and 30b respectively comprise a profiled section 37a and 37b which is bent to L-shape and is adjacent to abutment section 36a or 36b, respectively. Left hand profiled section 37a forms a vertical left hand sealing receiver 38a which extends along the left hand side 14a of cover housing 12 and is open towards cladding element 10. Right hand profiled section 37b also forms a vertical right hand sealing receiver 38a which extends along the right hand side part 14b of cover housing 12 and is open towards cladding element 10. A sealing element 39 partly protruding towards cladding element 10 is inserted into vertical sealing receivers 38a and 38b.

As is clear with the aid of FIG. 1, an oblique lid element 15 is connected at an angle α to front wall 13 of cover housing 12, which lid element forms a horizontal supporting section 16 bent towards cladding element 10. From inside of oblique lid element 15, a bar 17 is provided which is spaced apart from the supporting section and protrudes towards cladding element 10. Bar 17, together with bent horizontal support section 16, forms a horizontal seal receiver 18 open towards cladding element 10. A sealing element 39 which partly protrudes towards cladding element 10 is inserted in horizontal sealing receiver 18.

A continuous sealing receiver is formed at side parts 14a and 14b and horizontal supporting section 16 of cover housing 12 into which sealing element 39 is inserted as an elongate, one-piece elastic shaped part.

Figure 3:
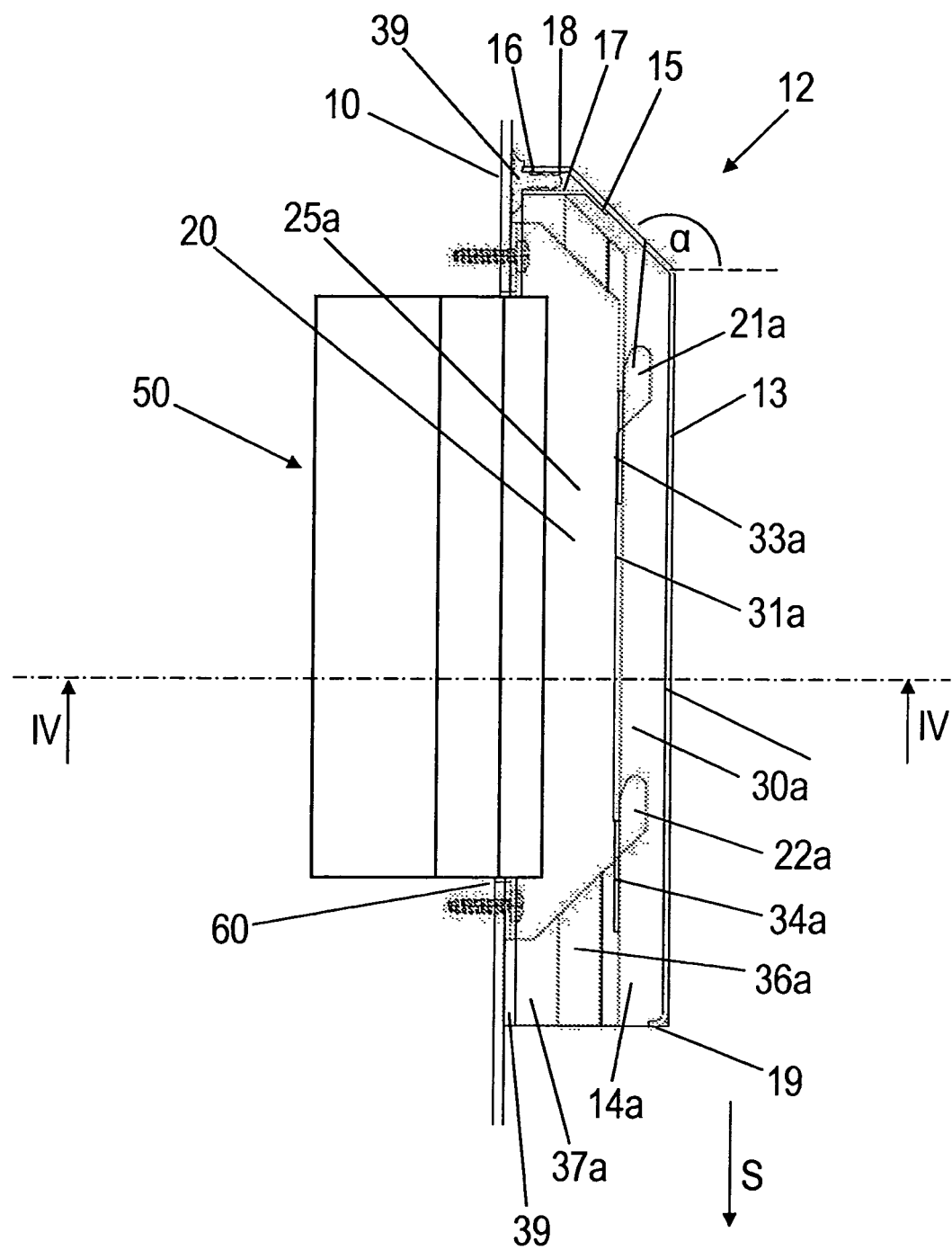
FIG. 3 in a schematic and sectioned side view the cover of FIGS. 1 and 2, wherein the cover housing is engaged with the holder.
Figure 4:
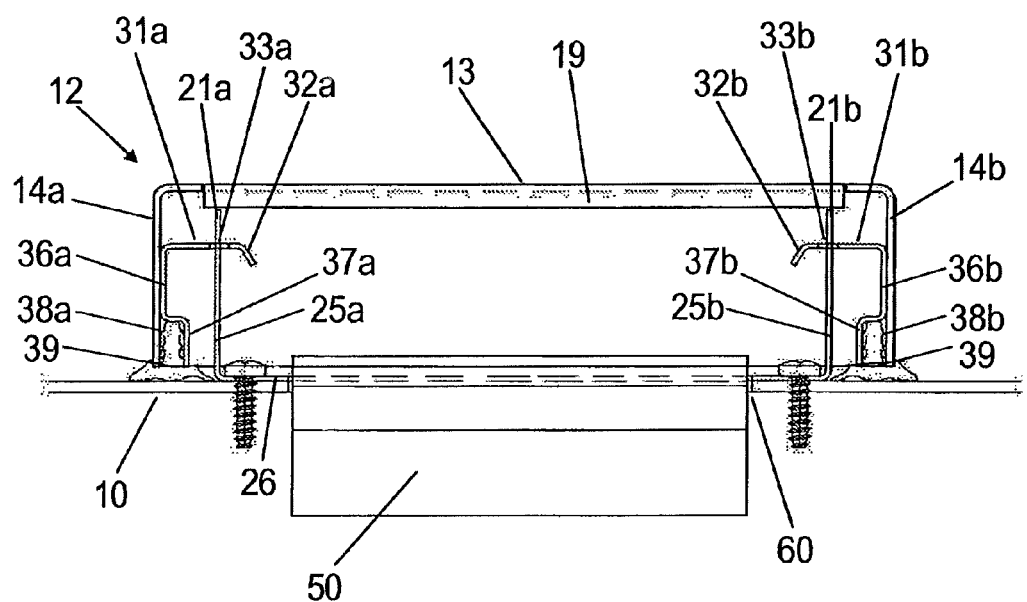
FIG. 4 in a schematic sectional view along section line IV-IV in FIG. 3 the cover of FIG. 3.

FIG. 3 shows in a schematic and sectional side view of the cover according to FIGS. 1 and 2, cover housing 12 being engaged with holder 20. FIG. 4 shows in a schematic sectional view along section line IV-IV of FIG. 3 the cover of FIG. 3.

In the illustrations of FIGS. 3 and 4, cover housing 12 having hook receptacles 33a and 34a which are formed as vertical receiving slots, is suspended by vertical hook elements 21a and 22a of holder 20 in direction of gravity according to arrow S. Continuous sealing element 39 which partly protrudes towards cladding element 10 is pressed into continuous sealing receptacle and deformed between cover housing 12 and cladding element 10.

When suspending hook receptacles 33a and 34a of cover housing 12 by hook elements 21a and 22a of holder 20, the protruding part of sealing element 39 contacts cladding element 10. When hook receptacles 33a and 34a are completely suspended by hook elements 21a and 22a, sealing element 39 is compressed so that a sealing abutment to cladding element 10 is created. Furthermore, sealing element 39 serves as a spring element, due to its elastic deformability, so that hook receptacles 33a and 34a are suspended by hook elements against the spring force thereof.

For dismounting cover housing 12, hook receptacles 33a and 34a of cover housing 12 must be disengaged from hook elements 21a and 22a of holder 20. Press force caused by the spring force of sealing element 39 must be overcome. To this end a force directed against the direction of gravity S can be applied to the lower edge region of cover housing 12, for example with the ball of the hand. The lower edge region of cover housing 12 is inwardly bent at front wall 13 and forms an edge protection 19 for the ball of the hand.

Figure 5:
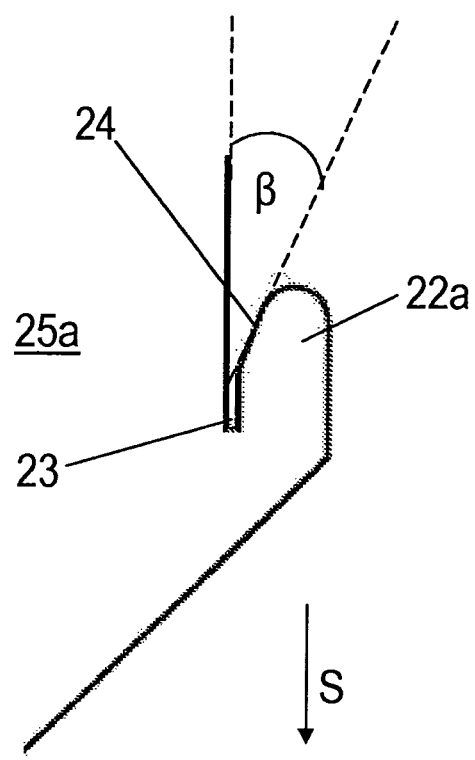
FIG. 5 in an enlarged illustration a region of a hook element illustrated in a dotted circle V of FIG. 1.

FIG. 5 shows in an enlarged illustration a region of hook element 22a illustrated in FIG. 1 in a dotted circle V. Hook element 22a comprises a vertical receiving gap 23 for hook receptacle 33a which is upwardly open. Hook element 22a extends from the hook tip to receiving gap 23 in an approach slope 24 inclined at an angle β. When hook receptacle 33a reaches the region of approach slope 24 during mounting, it is forced towards receiving gap 23 in a movement in direction of gravity S along the approach slope. Consequently, also cover housing 12 is forced towards cladding element 10 so that the protruding part of sealing element 39 sealingly contacts cladding element 10.

The invention claimed is:

1. A cover for at least one air-conditioning device arranged on a cladding element of a switchgear cabinet, comprising a cover housing having a front wall and side parts connected thereto, the side parts keeping the front wall at a distance from the cladding element and at least one holder for the cover housing being fitted to the cladding element and wherein the holder comprises vertical hook elements into which the cover housing can be suspended by hook receptacles in the direction of gravity, wherein the holder is directly connected to the cladding element, the hook receptacles provided at the cover housing are formed in receiving profiles connected to the side parts and extending along the side parts of the cover housing and respectively comprising at least one profiled section which carries the hook receptacles and is arranged transversely to the direction of protrusion of the hook elements;

the profiled section carrying the hook receptacles is bent at a free end thereof at an angle towards the cladding element for forming a mounting assist for the hook elements; and the receiving profiles respectively comprise an abutment section which is bent parallel to the associated side part of the cover housing and is adjacent to the profiled section carrying the hook receptacles, the abutment section being connected to the inner surface of the associated side part.

2. The cover of claim 1, wherein the holder comprises at least two legs which are spaced apart from another and protrude from the cladding element towards the cover housing, wherein each leg comprises at least one vertical hook element protruding from the legs towards the cover housing.

3. The cover of claim 2, wherein an opening in the cladding element is formed between the two legs in which the air-conditioning device can be arranged.

4. The cover of claim 2, wherein the holder comprises a U-shaped support having two legs which are interconnected by a connecting section.

5. The cover of claim 4, wherein an opening is formed in the connecting section between the two legs which is substantially aligned with the opening of the cladding element and in which the air-conditioning device can be arranged.

6. The cover of claim 1, wherein the receiving profiles comprise a profiled section which is bent to L-shape and is adjacent to the abutment section and which forms a vertical seal receiver extending along the side parts of the cover housing and open towards the cladding element, into which a sealing element may be inserted which at least partly protrudes towards the cladding element.

7. The cover of claim 1, wherein a lid element is connected at an angle to the front wall of the cover housing, which forms a horizontal supporting section bent towards the cladding element, wherein a bar is provided which protrudes from the inner surface of the lid element towards the cladding element and is spaced apart from the supporting section and which defines a horizontal seal receiver open towards the cladding element into which a sealing element may be inserted which at least partly protrudes towards the cladding element.

* * * * *